(12) United States Patent
Ikeda et al.

(10) Patent No.: US 6,625,071 B2
(45) Date of Patent: Sep. 23, 2003

(54) MEMORY CIRCUIT HAVING BLOCK ADDRESS SWITCHING FUNCTION

(75) Inventors: Mitsutaka Ikeda, Kawasaki (JP); Tsutomu Nakai, Kawasaki (JP); Koji Yamashita, Kawasaki (JP); Toshiyuki Kurita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/085,065

(22) Filed: Mar. 1, 2002

(65) Prior Publication Data

US 2002/0105840 A1 Aug. 8, 2002

(30) Foreign Application Priority Data

Feb. 8, 2001 (JP) ........................................ 2001-234664

(51) Int. Cl.⁷ ............................................. G11C 7/00
(52) U.S. Cl. ................................. 365/200; 365/185.09
(58) Field of Search ............................. 365/200, 201, 365/230.03, 185.09, 189.07

(56) References Cited

U.S. PATENT DOCUMENTS 5,495,447 A * 2/1996 Butler et al. ................. 365/200
5,586,075 A * 12/1996 Miwa .......................... 365/200
5,621,690 A * 4/1997 Jungroth et al. ............. 365/200
5,848,009 A * 12/1998 Lee et al. .................... 365/200
5,907,515 A * 5/1999 Hatakeyama ................ 365/200
5,914,907 A * 6/1999 Kobayashi et al. .......... 365/200

FOREIGN PATENT DOCUMENTS

JP           55-70998           5/1980

* cited by examiner

Primary Examiner—Tan T. Nguyen
(74) Attorney, Agent, or Firm—Arent Fox Kintner Plotkin & Kahn

(57) ABSTRACT

A memory circuit capable of salvaging defective cells, comprises a plurality of memory blocks each having a plurality of memory cells, a region which stores a block address of defective memory block that has defective cell, and a comparator circuit which compares the block address that is an object of access with the block address of the defective memory block, and detects access to the defective memory block, wherein in case where the comparator circuit detects access to the defective memory block, this defective memory block is replaced by the memory block that has the uppermost address (or lowermost address) among the plurality of memory blocks. In case where a plurality of defective memory blocks are present, the defective memory blocks are replaced with substitutive memory blocks having block addresses in order from the uppermost bit (or lowermost bit).

16 Claims, 10 Drawing Sheets

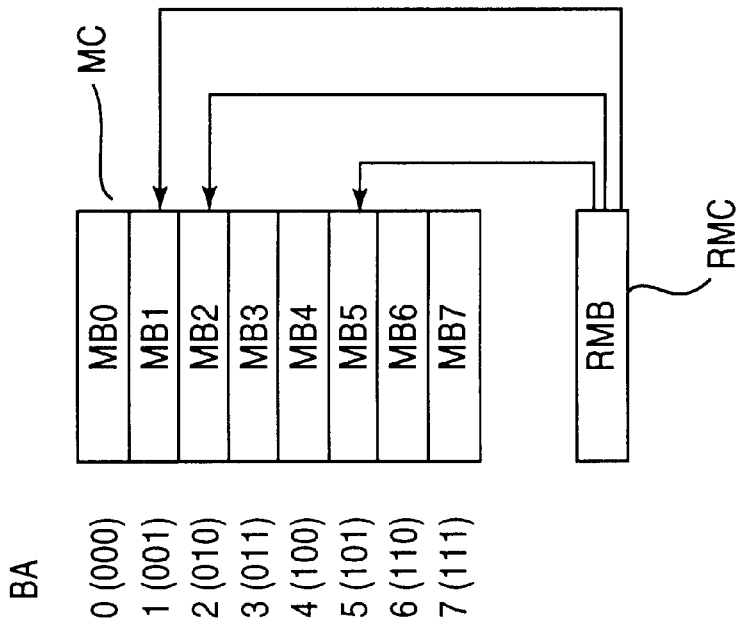
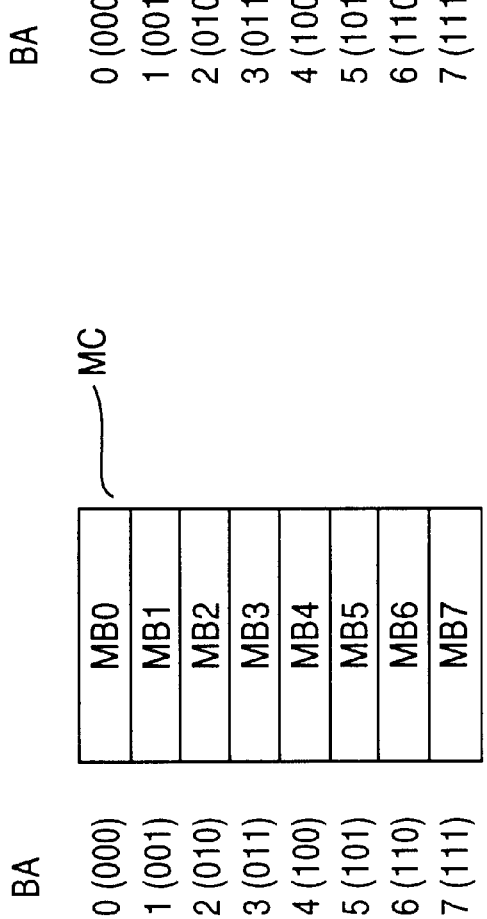
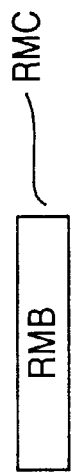

MEMORY CIRCUIT HAVING BLOCK ADDRESS SWITCHING FUNCTION

BACKGROUND OF THE INVENTION

1. Field of the Invention

The present invention relates to a memory circuit such as a flash memory or the like, and more particularly to a memory circuit which has a block address substituting function, and which salvages defective cells while using the memory cell region without any waste, and allows linear access.

2. Description of the Related Art

In the case of miniaturized semiconductor memory circuits, defective cells are generated as a result of the effects of contamination and the like, so that the yield tends to drop. Various methods have been proposed and realized in order to salvage such defective cells. The most common method is a redundant memory system in which a small-capacity redundant memory cell region is formed in addition to the ordinary memory cell region, and defective cells in the ordinary memory cell region are replaced by cells in the redundant memory cell region.

FIG. 1 is a diagram which illustrates a defective-cell salvage system utilizing conventional redundant memory cells. As is shown in FIG. 1A, the memory circuit has an ordinary memory cell region MC and a redundant memory cell region RMC. This is an example in the case of a flash memory, and the ordinary memory cell region MC is constructed from eight memory blocks MB0 through MB7, and the redundant memory cell region RMC has a capacity corresponding to a single memory block. Furthermore, as is shown in FIG. 1B, when defective cells are generated in the memory blocks MB1, MB2, MB5 and the like, these defective cells are replaced by cells in the redundant memory cell region RMC.

However, in the case of a defective cell salvage system utilizing such a redundant memory cell region, only the capacity of the ordinary memory cell region MC can be used at the most, whether the memory is completely good with no defective cells, or whether the memory is partially defective with some defective cells. Accordingly, the memory cells contained in the chip cannot be used effectively, and this is undesirable. Furthermore, the chip area is increased as a result of the installation of a redundant memory cell region.

Another defective cell salvage system is a method in which the uppermost address of the memory circuit is fixed when a defective block is generated, an access to half of the real memory cell region containing the defective block is prohibited, and this real memory cell region is used as a half-good product. In this system, special processing such as the prohibition of access by comparing addresses supplied from the outside with the address of the defective block or the like is unnecessary.

However, in the case of such method, if even one block is defective, the half of the memory cell region that contains this block becomes unusable, so that even if the half of the memory cell region that has become unusable contains non-defective blocks, these blocks cannot be utilized, and are therefore wasted.

Still another defective cell salvage system is a method in which the memory controller of the system mounting the memory circuit is informed of the addresses of memory blocks containing defective cells, and when an access to a defective block occurs, the access to this block is disabled on the memory controller side, so that access to defective blocks is avoided, in a manner similar to the method used in a hard disk or the like.

In the case of such a method, however, an excessive burden is placed on the system side, and the memory circuit cannot be accessed with a sequential increment or decrement of addresses, so that this method is not suited to memory applications in which there is (for example) frequent linear accessing of image data.

SUMMARY OF THE INVENTION

Accordingly, an object of the present invention is to provide a memory circuit equipped with a defective cell salvage function which allows the use of good memory cells formed on the chip with as little waste as possible.

Furthermore, another object of the present invention is to provide a memory circuit which salvages defective cells in the memory circuit without placing a burden on the system side, and which allows sequential access.

In order to achieve the abovementioned objects, one aspect of the present invention is a memory circuit which is capable of salvaging defective cells, and which comprises a plurality of memory blocks each having a plurality of memory cells, a region which stores a block address of defective memory block that has defective cell, and a comparator circuit which compares the block address that is an object of access with the block address of the defective memory block, and detects access to the defective memory block, wherein in case where the comparator circuit detects access to the defective memory block, this defective memory block is replaced by the memory block that has the uppermost address (or lowermost address) among the plurality of memory blocks. In case where a plurality of defective memory blocks are present, the defective memory blocks are replaced with substitutive memory blocks having block addresses in order from the uppermost bit (or lowermost bit).

In the abovementioned construction, in case where a block address accessed from the outside is the address of the defective memory block, the block address of this defective memory block is replaced by the block address of the uppermost (or lowermost) memory block. Alternatively, in cases where a block address accessed from the outside is the address of a defective memory block, the memory block with the uppermost (or lowermost) address is selected instead of the defective memory block. Accordingly, if this system is viewed from the outside, good memory blocks are assigned in order from the lowermost address (or uppermost address), and all good memory blocks can be accessed.

In a preferred embodiment, the substitutive memory blocks that are substituted for the defective memory blocks are assigned in order from the uppermost address (or lowermost address) among a plurality of memory blocks. Accordingly, the memory circuit has a memory region which stores substitutive block address corresponding to the defective block address, and has a switching circuit which replaces the defective block address with substitutive block address when it is detected by the comparator circuit that the block address being the object of access coincides with defective block address.

Alternatively, in another preferred embodiment, substitutive candidate memory block region which is substituted for defective memory block is installed in the uppermost address (or lowermost address) of a plurality of memory blocks, and in case where it is detected by the comparator circuit that block address being the object of access coincides with defective block address, a selection signal for memory block inside the substitutive candidate memory block region is activated. Furthermore, in cases where no defective memory block is present, all of the memory blocks including the substitutive candidate memory block region within the plurality of memory blocks can be accessed.

BRIEF DESCRIPTION OF THE DRAWINGS

FIG. 1 is a diagram which illustrates a defective cell salvage system utilizing conventional redundant memory cells;

DESCRIPTION OF THE PREFERRED EMBODIMENTS

Embodiments of the present invention will be described below with reference to the attached figures. However, the protected scope of the present invention is not limited to the embodiments described below, but extends to the inventions described in the claims, and equivalents thereof.

Figure 2:
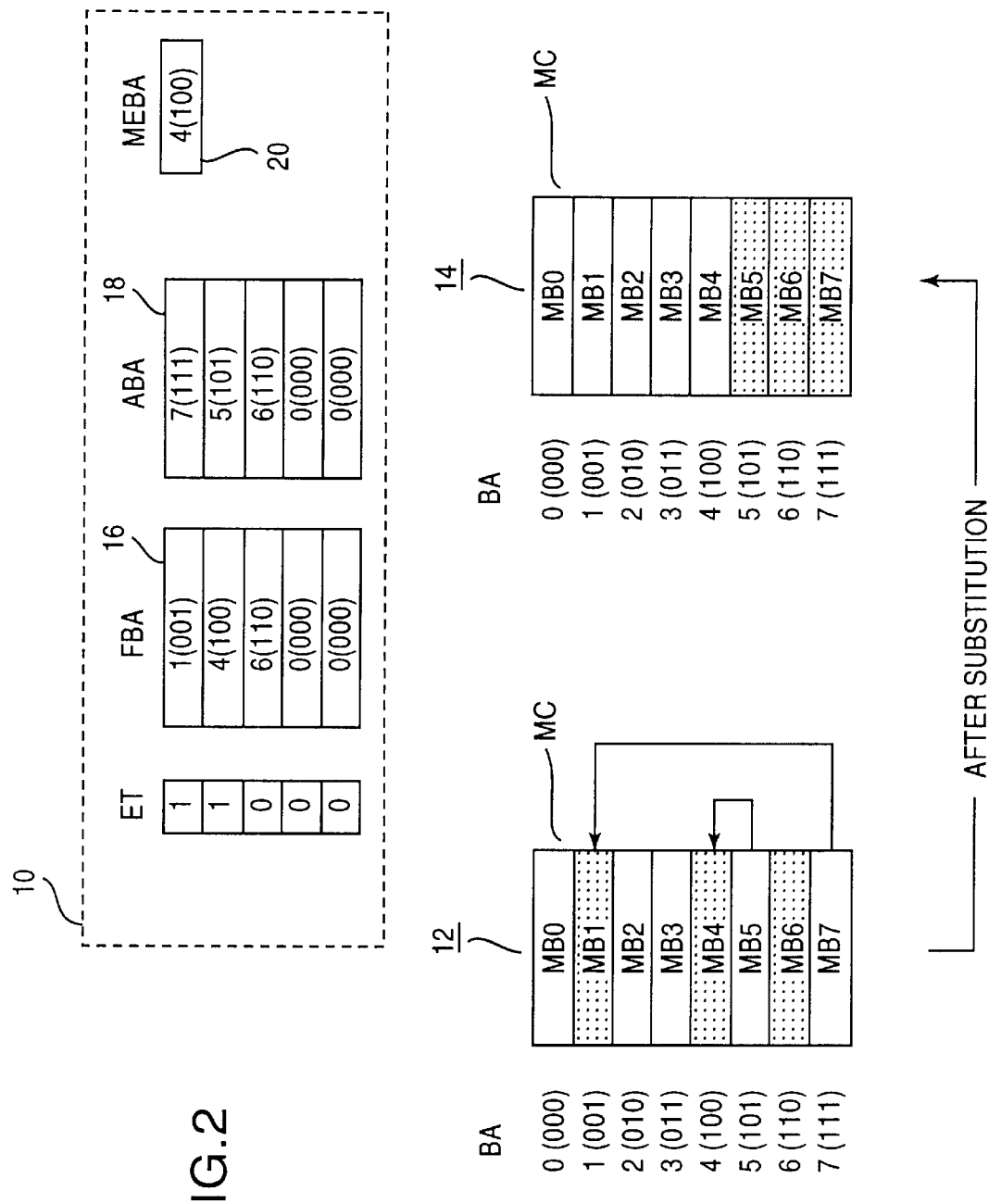
FIG. 2 is a diagram which is used to illustrate a first embodiment.

FIG. 2 is a diagram which is used to illustrate a first embodiment. In a memory circuit in which a memory cell region MC containing eight memory blocks MB0 through MB7 is formed, as is indicated by 12 in the figures, the substitution of block addresses BA is performed so that three memory blocks MB1, MB4 and MB6 (indicated by a shaded pattern in the figures) containing defective cells are replaced by memory blocks MB7 and MB5 in order from the memory block with the uppermost address. As a result, as is shown by 14 in the figures, the memory circuit seen from the outside is a product in which three defective memory blocks among the eight memory blocks in the memory cell region MC cannot be used, and five memory blocks can be accessed. Furthermore, the five memory blocks that can be accessed are disposed in order from the lowermost address.

For example, it is desirable that such a memory circuit be used in a bottom boot flash memory. Specifically, in such a bottom boot memory, accessing is performed in order from the lowermost address during the rise of the power supply and the like. Accordingly, such a circuit can be used in a bottom boot memory by allocating defective memory blocks on the side of the uppermost address, and lining up good memory blocks MB0 through MB4 in order from the lowermost address.

Then, with the defective memory blocks excluded, all of the good memory blocks can be accessed, so that good memory blocks can be accessed to the maximum extent.

A block address memory unit 10, a comparator circuit (described later) and the like are provided in order to realize the substitution of the abovementioned block memory. The block address memory unit 10 has a defective block address FBA storage region 16, a corresponding substitutive block address ABA storage region 18, an effective table region ET which indicates whether or not the correspondence between the abovementioned two regions is effective or not, and storage region 20 for the maximum effective block address (MEBA) 20 which is the maximum address among the effective blocks MB0 through MB4.

In the first embodiment, a plurality of pairs of defective block address storage regions and substitutive block address regions are provided, and when defective blocks are found in the memory load test, the defective block addresses FBA are recorded in the defective block address storage region 16, substitutive block addresses ABA are recorded in the substitutive block address storage region 18, and an indication as to whether or not these addresses are effective is recorded in the effective table ET. In cases where there is a plurality of defective blocks, the substitutive blocks are allocated in order from the uppermost address. Here, in the above case, when memory block that is the object of substitution is defective block (MB6 in the figures), the defective block is skipped, and the next available memory block is designated as substitutive memory block.

Furthermore, when defective blocks are replaced, the number of effective memory blocks in the memory circuit as a whole decreases. Accordingly, the maximum effective block address MEBA is recorded in the storage region 20, and a check is made in order to ascertain whether or not the block addresses that are the object of access exceed the maximum effective block address MEBA.

In the memory circuit of the first embodiment, the block addresses among the input addressed are compared with the defective block addresses FBA, and if these addresses coincide, the input block addresses are replaced by corresponding substitutive block addresses ABA, and an internal memory cell region is accessed according to the substitutive block address. Furthermore, in cases where the accessed block addresses exceed the maximum effective block address MEBA, the memory device enters a busy state or disable state, and access is prohibited.

This will be described using the concrete example shown in FIG. 2. In a case where defective blocks MB1, MB4 and MB6 are found in the load test as indicated by 12 in the figures, the number of defective blocks is counted, and the maximum block address "4(100)" of the effective blocks is recorded in the maximum effective block address region 20 from the difference between the total number of blocks "8" and the number of defective blocks "3".

Next, all of the defective block addresses FBA and substitutive block addresses ABA are respectively recorded in the storage regions 16 and 18, and at the same time, data "1" indicating that the correspondence table of these addresses is effective is recorded in the effective table ET. In the example shown in FIG. 2, the block address BA "1(001)" of the defective block MB1 and the block address BA "7(111)" of the substitutive block MB7 that is substituted for this defective block MB1, and the block address BA "4(100)" of the defective block MB4 and block address BA "5(101)" of the substitutive block MB5 that is substituted for this defective block MB4, are respectively recorded, and "1" is recorded in the effective table ET. Since the substitutive candidate block MB6 is a defective block, this block is skipped so that the memory block MB5 becomes an substitutive block.

Furthermore, since the defective block MB6 exceeds the maximum effective block address MEBA=4(100), the allocation of an substitutive block is not performed for this block. However, the defective block address "6(110)" is respectively recorded in the storage regions 16 and 18 shown in FIG. 2. This will be described later.

Furthermore, when the memory circuit is used, block addresses BA that are the object of access are compared with defective block addresses FBA, and in cases where these addresses coincide and the effective table ET is an effective bit, the accessed block addresses are replaced by substitutive block addresses ABA, and the memory cells are accessed according to them ABA. Furthermore, in cases where block addresses BA that are the object of access exceed the maximum effective block address MEBA, the memory device enters a state in which access is prohibited.

As a result, as is indicated by 14 in FIG. 2, the five memory blocks MB0 through MB4 from the lowermost address become accessible, and these blocks can be sequentially accessed in the order of the addresses. Furthermore, all of the five good memory blocks are usable, so that effective utilization of the memory cells is possible.

Figure 3:
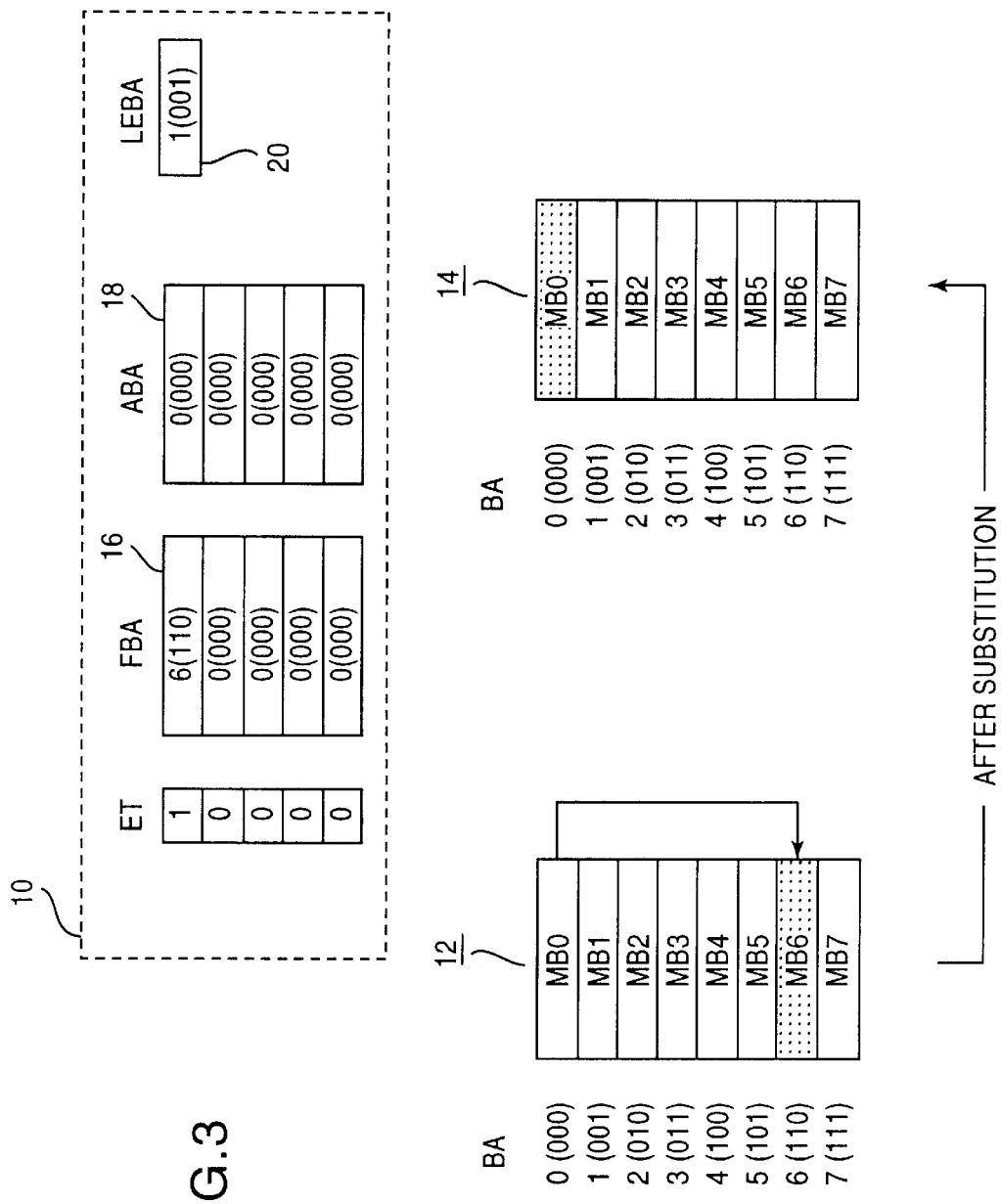
FIG. 3 is a diagram which is used to illustrate a modification of the first embodiment.

FIG. 3 is a diagram which is used to illustrate a modification of the first embodiment. While FIG. 2 shows a bottom boot flash memory, the example shown in FIG. 3 is applied to a top boot flash memory. Since this top boot memory is accessed in order from the uppermost address when the power supply is switched on, the substitutive blocks for defective blocks are selected in order from the lowermost address.

In the example shown in FIG. 3, as is indicated by 12 in the figures, a memory block MB6 whose block address BA is "6(110)" (among the eight memory blocks) contains a defective cell. Accordingly, this defective block MB6 is replaced by the memory block MB0 which has the lowermost address. As a result, the defective block address FBA "6(110)" is recorded in the defective block address storage region 16, and the substitutive block address "0(000)" is recorded in the corresponding substitutive block address storage region 18. Then, data "1" indicating an effective state is recorded in the effective table ET. Furthermore, "1(001)" is recorded as the least effective block address LEBA.

As a result, as is indicated by 14 in the figures, the block addresses as seen from the outside are as follows: specifically, the memory block MB0 with the lowermost address is a defective block, and the remaining memory blocks MB1 through MB7 are good blocks. In other words, when access is performed in order from the uppermost address, the memory blocks MB7 through MB1 can be accessed normally, and access is prohibited only for the memory block MB0 with the lowermost address. Accordingly, a single defective block is excluded, and seven memory blocks can be used, so that there is no waste.

Figure 4:
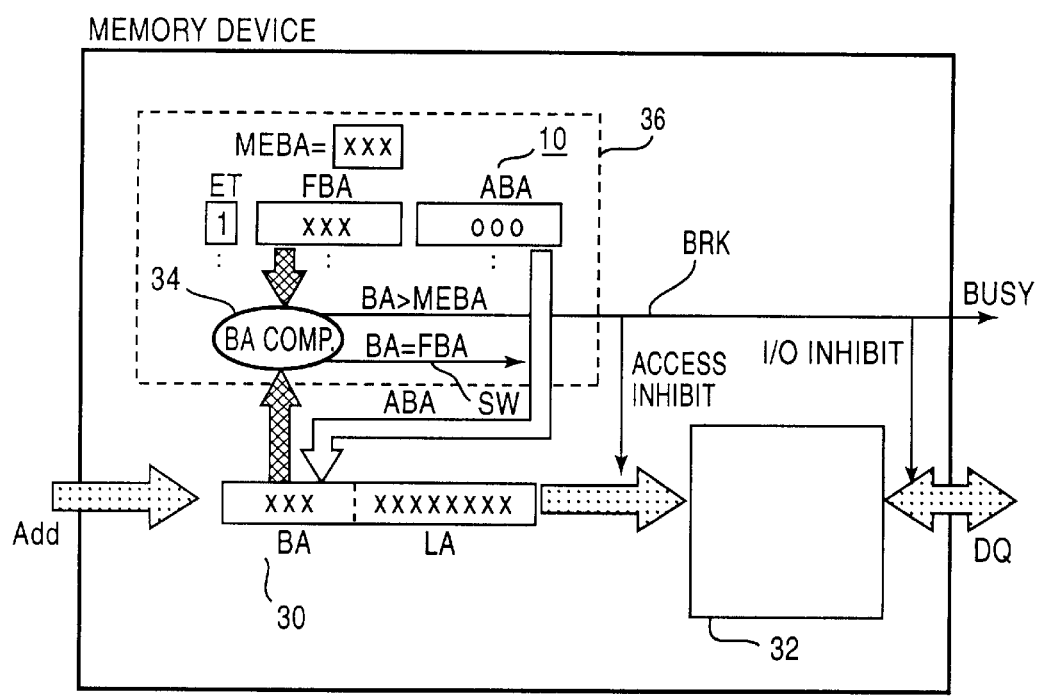
FIG. 4 is a structural diagram of the memory circuit in the first embodiment.

FIG. 4 is a structural diagram of the memory circuit used in the first embodiment. This memory has address latch part 30 in which external addresses Add are input and latched, an internal memory circuit 32 which has memory cells that are accessed according to addresses from the address latch part 30, and data input and output terminals DQ. Furthermore, the memory circuit has a memory block switching circuit 36.

This memory block switching circuit 36 has a block address memory unit 10 which has a defective block address (FBA) storage region, an substitutive block address (ABA) storage region, a maximum effect block address (MEBA) storage region and the like, and a block address comparator part 34 which compares the block address BA consisting of the upper bits among the addresses latched in the address latch part 30 with defective block addresses FBA.

As is shown in FIG. 4, in cases where the block address BA of the external address Add coincides with the defective block address FBA, a switching signal SW is generated, and the block address of the address latch part 30 is replaced by the corresponding substitutive block address ABA. This substituted block address BA and the local address LA consisting of the lower bits are supplied to the internal memory circuit 32, and the memory cells are accessed.

Furthermore, in cases where a block address BA that is the object of access exceeds the maximum effective block address MEBA, the block address comparator part 34 outputs a break signal BRK, and (1) prohibits access to the internal memory circuit by inactivating the decoder, (2) prohibits the input and output of data via the data input and output terminals DQ, or (3) outputs a busy signal BUSY indicating an access-prohibited state, and thus informs the system side that access is prohibited. As a result, even if the system side erroneously accesses a memory block that cannot be accessed, access is not permitted.

Various methods are conceivable as methods for generating the break signal BRK. The first method is a method in which in a bottom boot memory a check is made (as described above) by the block address comparator part 34 as to whether or not an input block address BA exceeds the maximum effective block address MEBA. In the case of a top boot memory, a check is made in order confirm that the input block address BA is less than the least effect block address LEBA. In this method, the construction of the checking circuit of the block address comparator part 34 is simple.

The second method is a method in which a check is made by the block address comparator part 34 as to whether or not an input block address BA coincides with an substitutive block address ABA. In this method, block addresses of blocks (MB6 in FIG. 2) which contain defective cells and for which substitution is considered unnecessary as a result of the addresses of these blocks being greater than the maximum effective block address for substitution are also stored in the substitutive block address storage region ABA. This second method has the merit of making a maximum effective block address storage region unnecessary unlike in the first method.

Furthermore, the third method is a method in which a check is made as to whether or not an input block address BA coincides with effective block addresses. In this case, a separate effective block address storage region is required. However, in cases where the number of defective blocks is much smaller than the number of effective blocks, the number of effective blocks that are the object of comparison is increased in the third method, so that that this method is not very desirable in such cases. The method in which the construction of the block address comparator part 34 is simplest is selected from the first, second and third methods.

FIG. 5 is a diagram which illustrates the block switching operation during accessing in the memory circuit shown in FIG. 4. Defective block addresses FBA, substitutive block addresses ABA, effective table data ET and a maximum effective block address of the memory shown in FIG. 2. are recorded in storage regions in the memory block switching circuit 36.

Figure 5A:
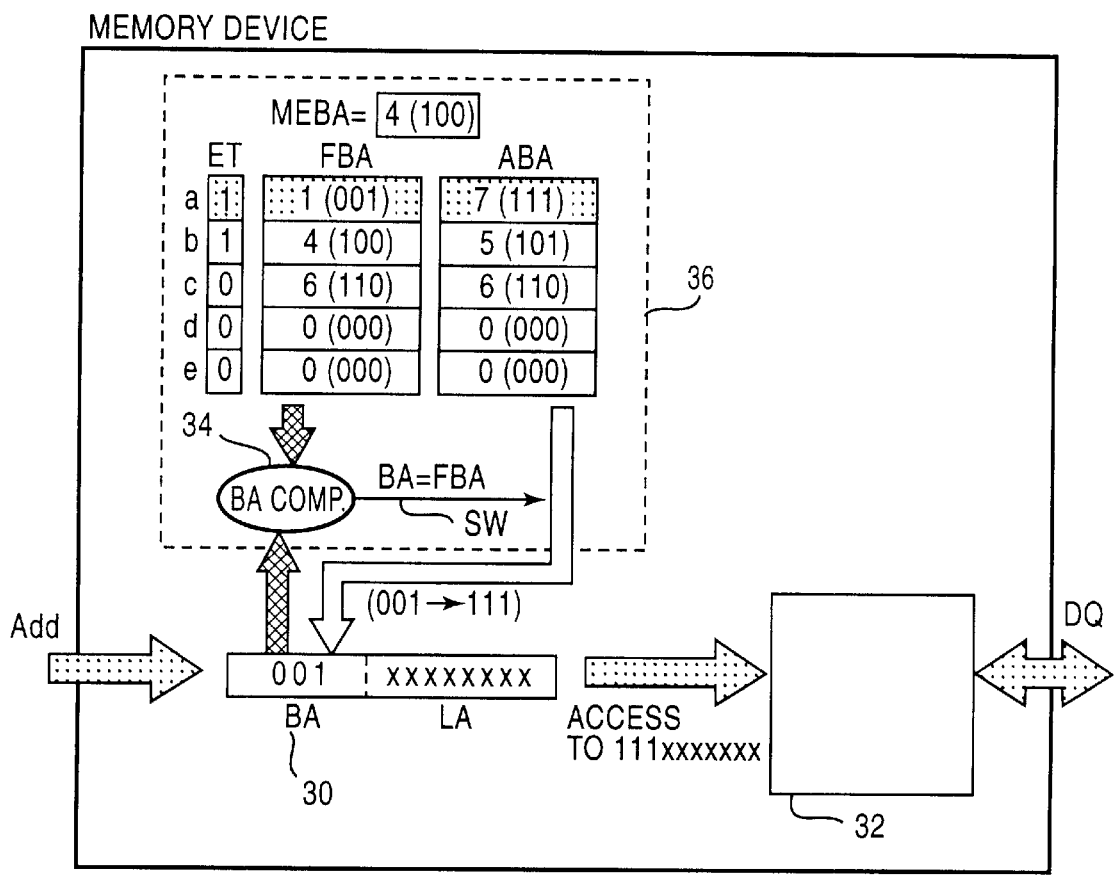
FIG. 5 is a diagram which illustrates the block switching operation during access in the memory circuit shown in FIG. 4.

FIG. 5A shows an example of the operation in a case where the input block address BA is "1(001)". Here, the block address comparator part 34 detects that the input block address BA and the defective block address FBA coincide, and outputs the switching signal SW. In response to this switching signal SW the corresponding substitutive block address ABA "7(111)" is supplied to the address latch part 30. As a result, the block address that is accessed is "111".

Figure 5B:
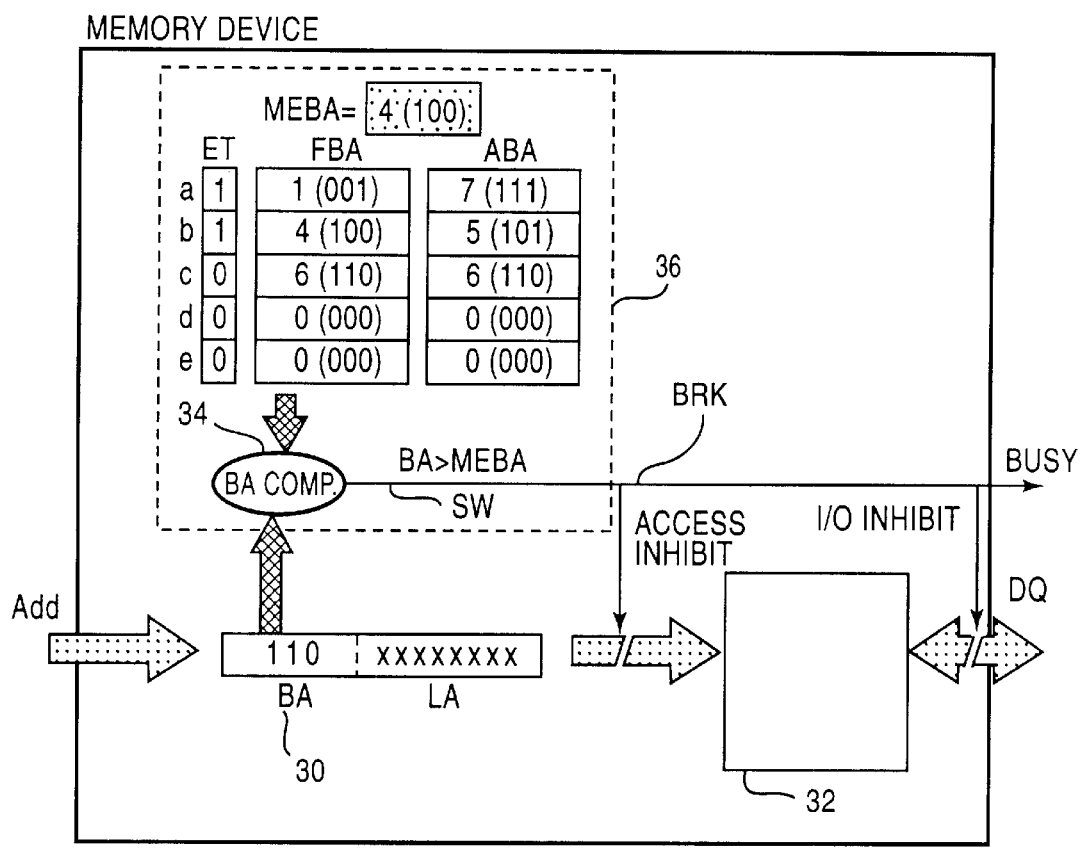

FIG. 5B shows an example of the operation in a case where the input block address BA is "6(110)". Here, the block address comparator part 34 makes a check in order to ascertain whether or not the input block address BA exceeds the maximum effective block address MEBA (4(100)). In this case, since the input block address does exceed the maximum effective block address, a break signal BRK is output, and access is prohibited.

As another method, a break signal BRK may be output in cases where a comparison of the input block address BA and substitutive block address ABA by the block address comparator part 34 indicates that the addresses coincide. Here, as was described in FIG. 2, it is necessary to record the defective block address that exceed the maximum effective block address in the substitutive block address region ABA. Then, in regard to the effective table data ET in this case, data "0" indicating an ineffective state is recorded. In other words, in the case of the defective block MB6, the defective block address FBA is recorded as "6(110)", the corresponding substitutive block address ABA is also recorded as "6(110)", and the effective table data is set at "0". As a result, a break signal BRK can be output in cases where the block address comparator circuit 34 compares the input block address BA and the substitutive block address ABA, and finds that the two addresses coincide.

Figure 6A:
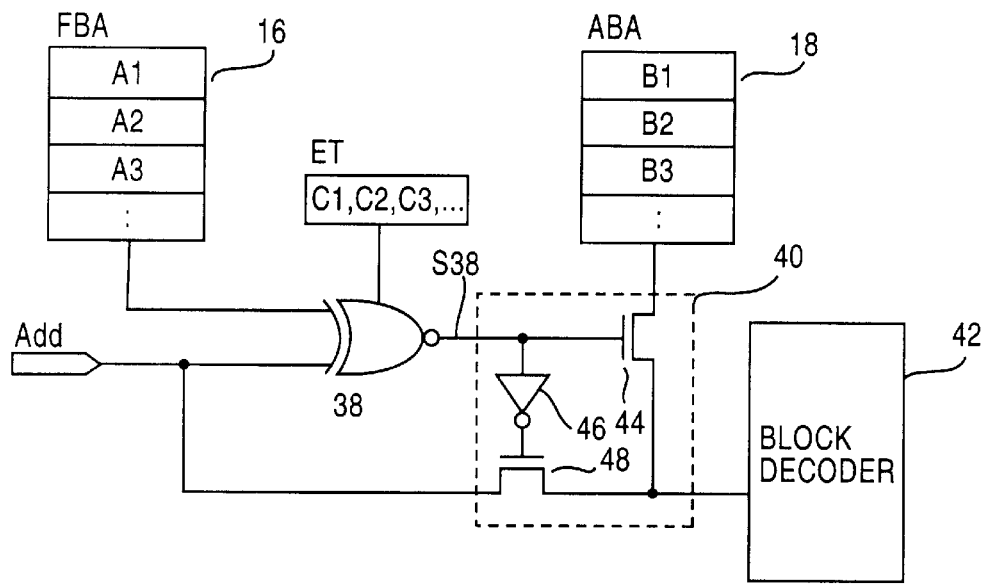
FIG. 6 is a diagram which shows the concrete circuit construction of the block address switching circuit.

FIG. 6 is a diagram which shows the concrete circuit construction of the memory block switching circuit 36. FIG. 6A shows the comparator circuit and switching circuit in the block address comparator part 34. The block address of the upper bits among the addresses input from the outside is compared with the defective block address FBA inside the defective block address storage region 16 by a comparator circuit 38 consisting of an ENOR circuit. However, in cases where the effective table ET has ineffective data, the operation of this comparator circuit 38 is not performed.

When the comparator circuit 38 detects that an input block address and defective block address FBA coincide, the comparator circuit 38 sets the output signal S38 at the H level, switching the transistor 44 of the block address switching circuit 40 on, and switching the transistor 48 off. As a result, an substitutive block address ABA is supplied to the block decoder 42 instead of the external block address. Consequently, a good block corresponding to the substitutive block address ABA is selected instead of the defective block corresponding to the defective block address. Furthermore, when the comparator circuit 38 detects that an input block address and defective block address FBA do not coincide, the comparator circuit 38 sets the output signal S38 at the L level, switching the transistor 44 of the switching circuit 40 off, and switching the transistor 48 on, so that the external block address is supplied "as is" to the block decoder 42.

Furthermore, in cases where the effective table ET is ineffective, the comparator circuit 38 sets the output S38 at the L level, and performs the same operation as in the abovementioned case in which the addresses do not coincide.

Figure 6B:
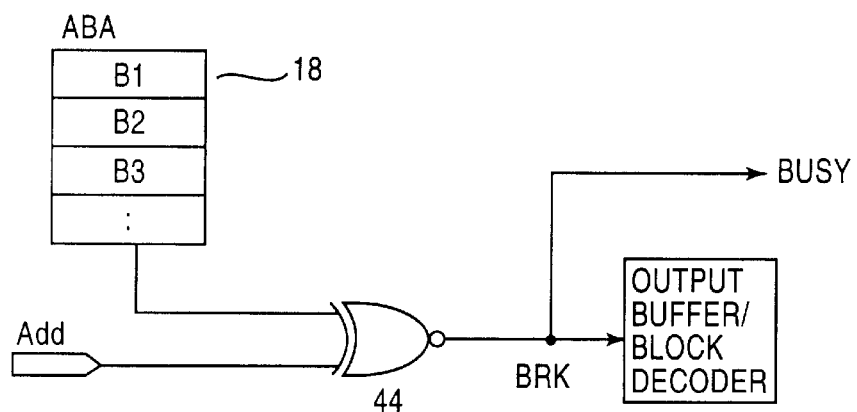

The invalid access detection circuit shown in FIG. 6B has a comparator circuit 44; this comparator circuit 44 compares external block addresses Add with the substitutive addresses ABA in the substitutive block address storage region 18, and in cases where these addresses coincide, the output break signal BRK is set at the H level and activated; in this case, the operation of the output buffer and block decoder is inactivated, and a busy signal BUSY is output to the outside.

In the case of a bottom boot memory, as was described above, the invalid access detection circuit may also detect whether or not an external block address exceeds the maximum effective block address. Furthermore, in the case of a top boot memory, it is detected whether or not this external block address is less than the least effective block address.

Figure 7:
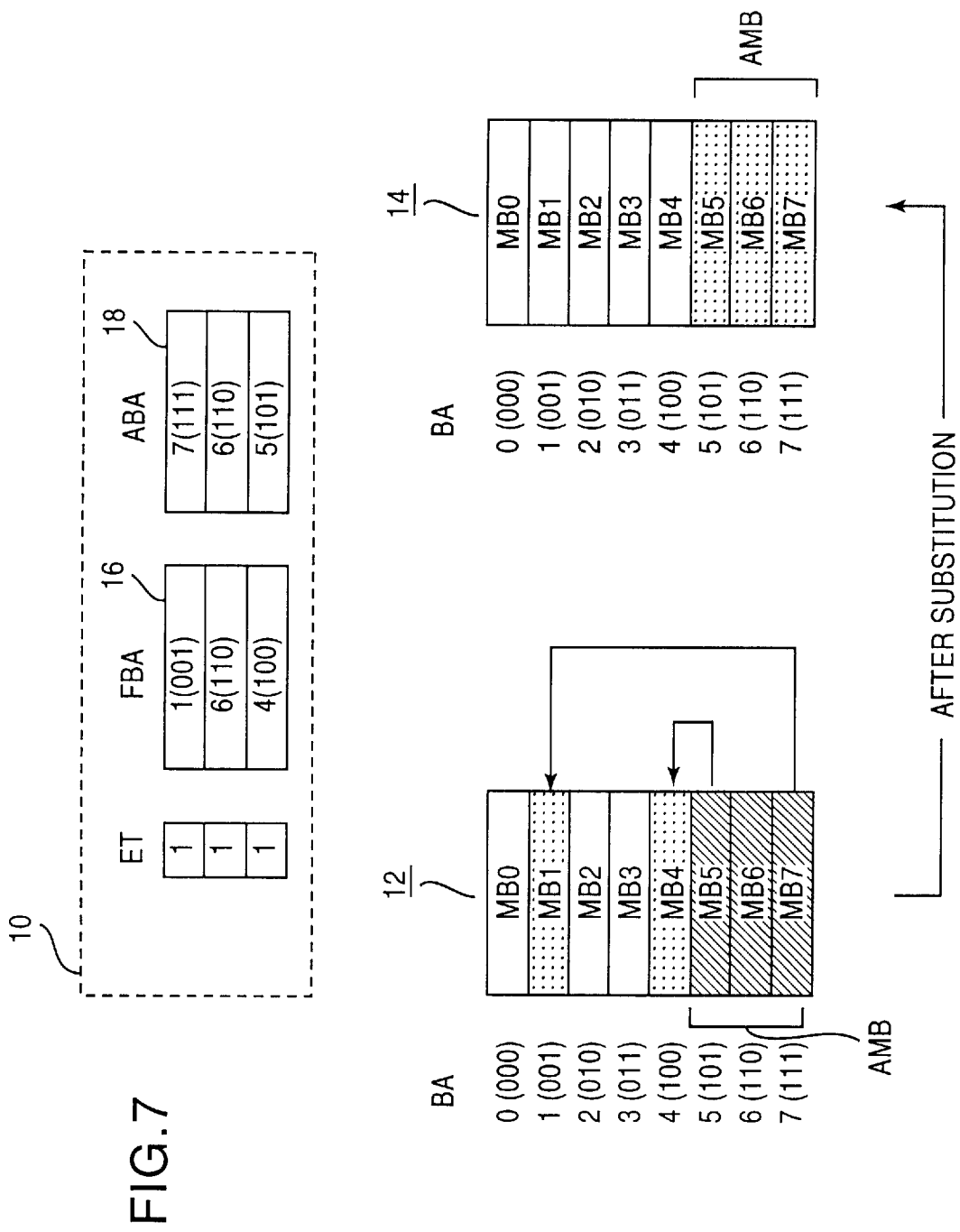
FIG. 7 is a diagram which illustrates the memory circuit in a second embodiment.
Figure 8:
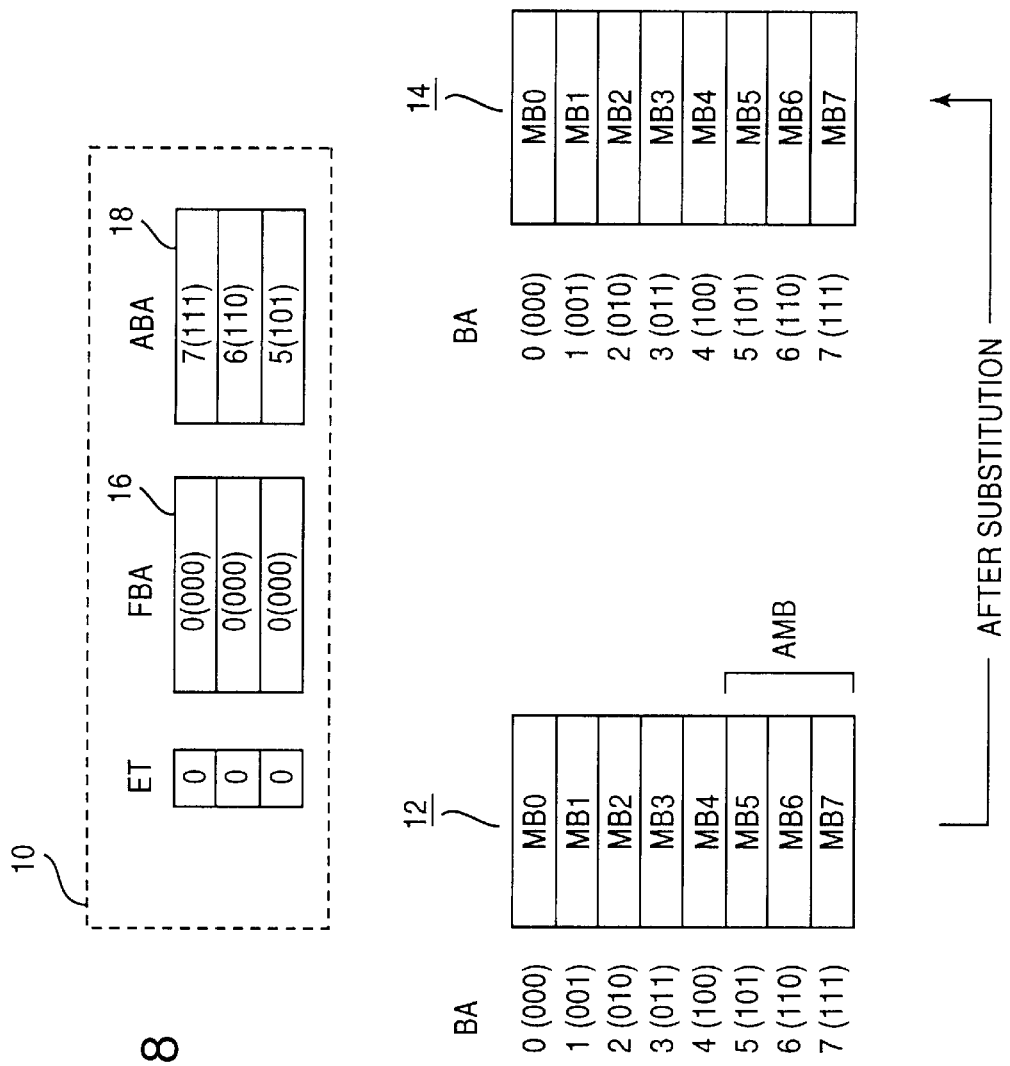
FIG. 8 is a diagram which illustrates the memory circuit in this second embodiment.

FIGS. 7 and 8 are diagrams that illustrate the memory circuit in a second embodiment. In the memory circuit of this second embodiment, some of the memory blocks are determined beforehand as exclusive substitutive blocks; in cases where there are defective blocks among the memory blocks, these defective memory blocks are replaced by such exclusive substitutive blocks. On the other hand, in cases where no defective blocks are present, the exclusive substitutive blocks are utilized as ordinary memory blocks.

The example shown in FIG. 7 illustrates a case in which defective blocks are present. As is indicated by 12 in the figures, the three memory blocks MB7, MB6 and MB5 are fixed as blocks AMB used exclusively for substitution from the uppermost address among the memory blocks MB0 through MB7. Furthermore, the memory blocks MB0 through MB4 are utilized as ordinary blocks. In a case where defective blocks MB1 and MB4 (among the ordinary blocks) and a defective block MB6 (among the exclusive substitutive blocks) are detected, the defective block MB1 among the ordinary blocks is replaced by the uppermost block MB7 among the exclusive substitutive blocks, and the defective block MB4 is replaced by the next good block MB5 among the exclusive substitutive blocks. As a result, in the memory following substitution, as is indicated by 14 in the figures, the memory blocks MB0 through MB4 other than the blocks AMB used exclusively for substitution (consisting of the three uppermost blocks) are accessible blocks.

Accordingly, in the block address memory unit 10, defective block addresses FBA are recorded in the defective block address storage region 16. However, the three uppermost block addresses are always recorded in the substitutive block address storage region 18. Specifically, in the second embodiment, one or a plurality of the uppermost memory blocks are installed as exclusive substitutive blocks in the case of bottom boot memory. Furthermore, in cases where defective blocks are present on the chip, these exclusive substitutive blocks are all used to replace the defective blocks. Even in cases where there is only one defective block, three exclusive substitutive blocks are utilized to replace this defective block.

Furthermore, in the case of a top boot memory, exclusive substitutive blocks are allocated to one or a plurality of memory blocks with the lowermost addresses.

FIG. 8 shows an example of a case in which there are no defective blocks. As is indicated by 12 in the figures, the three uppermost memory blocks are installed as blocks AMB used exclusively for substitution. However, in a case in which no defective blocks are detected in the load test, these blocks AMB used exclusively for substitution can be accessed as ordinary memory blocks. 14 in the figures indicates the memory block construction as seen from the outside. Here, all of the memory blocks MB0 through MB7 can be accessed.

In this case, the addresses of three memory blocks are recorded in the substitutive block address region 18 of the block address memory unit 10; however, no addresses are recorded in the defective block address region 16, and the effective table ET is also in a completely ineffective state "0". In other words, the exclusive substitutive blocks are used as ordinary memory blocks.

The second embodiment differs from the memory circuit with the redundant construction shown in FIG. 1 in the following respects. Specifically, in the memory circuit of the second embodiment, all of the memory blocks can be accessed in cases where no defective blocks are present; however, in cases where defective blocks are present, these blocks are replaced by exclusive substitutive blocks. Accordingly, as is shown in FIGS. 7 and 8, all of the memory cells in the chip can be accessed in cases where no defective blocks are present, so that a large capacity is obtained. On the other hand, in cases where defective blocks are present, the capacity is decreased by an amount corresponding to the exclusive substitutive blocks.

On the other hand, in the case of a memory circuit with a redundant construction, the capacity is smaller than the total memory capacity by an amount corresponding to the capacity of the redundant memory, regardless of whether defective blocks are present or not. In other words, in cases where no defective cells are present, the memory circuit of the second embodiment allows more effective utilization of the memory cells than a memory with a redundant construction.

Figure 9:
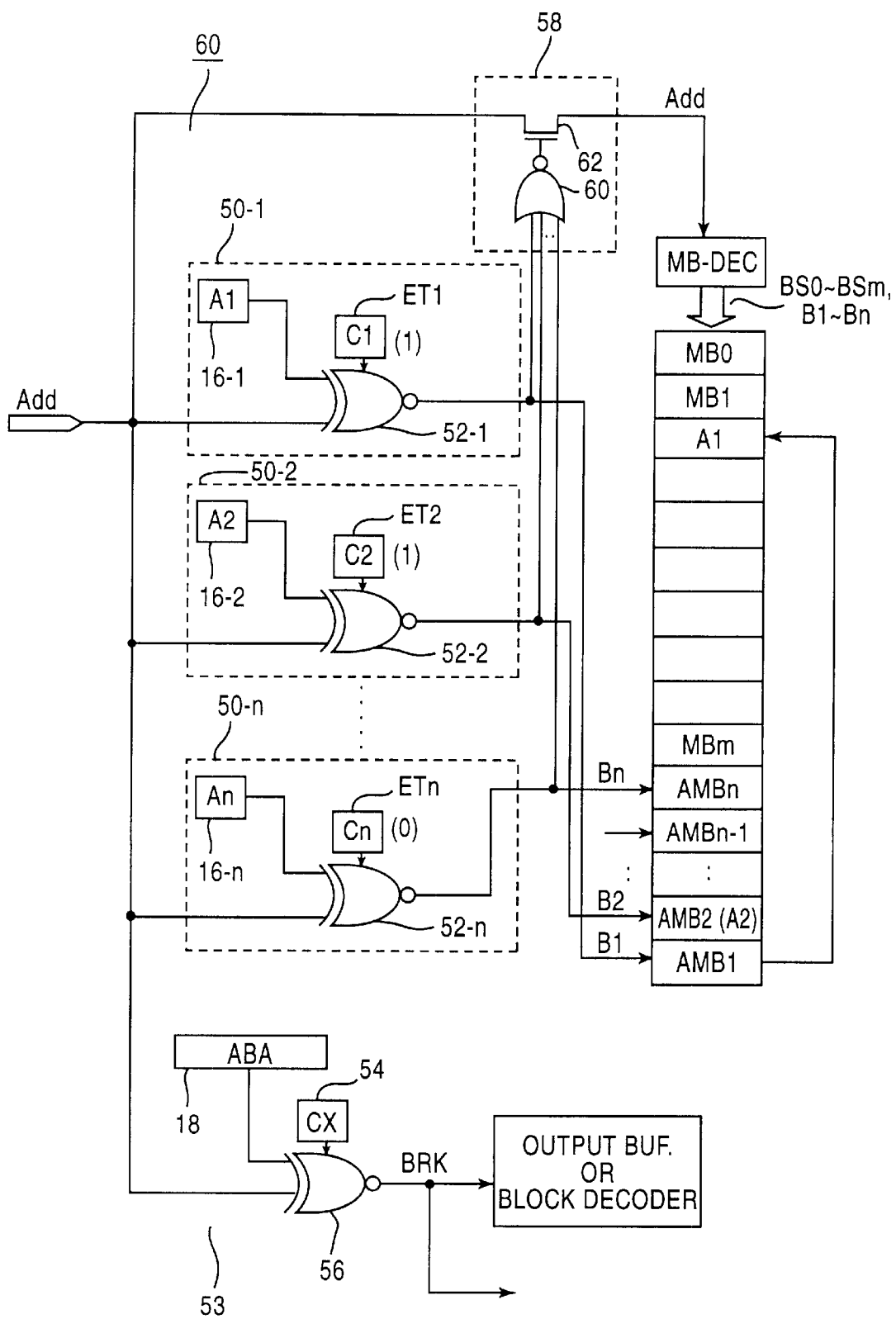
FIG. 9 is a structural diagram of the memory circuit in the second embodiment.

FIG. 9 is a structural diagram of the memory circuit used in the second embodiment. First, in addition to the memory blocks MB0 through MBm, the memory cell region also includes substitutive candidate memory blocks AMB1 through AMBn. These memory blocks MB0 through MBm and AMB1 through AMBn have a construction that allows selection by memory block selection signals BS0 through BSm and B1 through Bn generated by the memory block decoder MB-DEC. Accordingly, in cases where no defective memory blocks are present, all of these memory blocks MB0 through MBm and AMB1 through AMBn can be accessed.

In cases where defective memory blocks are present, the defective blocks are replaced with substitutive candidate blocks by a memory block switching circuit 60. Accordingly, block address comparator circuits 50-1 through 50-n are installed corresponding to the respective substitutive candidate blocks AMB1 through AMBn. Comparator circuits 52-1 through 52-n which compare defective block addresses and external input block addresses are respectively installed in the block address comparator circuits 50-1-n, and defective block address storage regions 16-1 through 16-n are respectively installed in the comparator circuits. Furthermore, the comparison operations of the respective comparator circuits are enabled or disabled by the effective table bits ET1 through ETn.

In the second embodiment, the outputs of the block address comparator circuits are sent directly to the substitutive candidate blocks AMB1 through AMBn as block selection signals B1 through Bn. The signal lines of these block selection signals B1 through Bn are formed in a fixed manner beforehand prior to the load test. Furthermore, the outputs of the block address comparator circuits are sent to the NOR gate 60 of the block address switching circuit 58, and if any of the outputs is at the H level, the transistor 62 inside the switching circuit 58 is switched off, so that the sending of external input addresses Add to the memory block decoder MB-DEC is prohibited. Instead, the H level outputs of the block address comparator circuits are sent to the substitutive candidate blocks as block selection signals B1 through Bn, so that the directly corresponding substitutive candidate blocks are selected.

Furthermore, the invalid access detection circuit 53 inside the memory block switching circuit 60 prohibits access to the substitutive candidate blocks AMB1 through AMBn in cases where defective memory blocks are present. For this purpose, the invalid access detection circuit 53 has a comparator circuit 56 which compares substitutive candidate block addresses ABA recorded permanently in the substitutive block address storage region 18 with the block addresses of external input addresses. Furthermore, this comparator circuit 56 is activated when good/bad data 54 indicating the presence or absence of defective blocks is data "1" that indicates the presence of defective blocks, and is inactivated when this data 54 is data "0" that indicates the absence of defective blocks. Accordingly, if external input block addresses coincide with substitutive candidate block addresses ABA, a break signal BRK is output, the output buffer and decoder are inactivated, and a busy signal BUSY is output to the outside.

In FIG. 9, a case is illustrated in which two defective blocks A1 and A2 are present. Since defective blocks are present, the good/bad data 54 is data "1" indicating the presence of defective blocks, and the comparator circuit 56 of the invalid access detection circuit 53 is in an activated state. Accordingly, in cases where block addresses input from the outside coincide with the block addresses of the substitutive candidate blocks AMB1 through AMBn, a break signal BRK is output.

Furthermore, the block addresses of the defective blocks A1 and A2 detected in the load test are respectively recorded in the defective block address storage regions 16-1 and 16-2 of the block address comparator circuits 50-1 and 50-2, and effective data "1" is respectively recorded in the corresponding effective tables ET. The comparator circuits 52-1 and 52-2 thereby become active. Accordingly, in cases where a block address of an external input address coincides with the defective block address A1, the output of the comparator circuit 52-1 is set at the H level, the block selection signal B1 which selects the substitutive candidate block AMB1 is set at the H level, and the substitutive candidate block AMB1 is accessed instead of the defective block A1.

The block address A2 of the defective block A2 is also recorded; accordingly, if an external input block address coincides with this block address A2, the comparator circuit 52-2 outputs an H level. In this case, however, a break signal BRK is output by the invalid access detection circuit 53, so that the access itself is disabled. Accordingly, it is not absolutely necessary to record the defective block address A2 in the defective block address storage region 16-2.

Since ineffective data "0" is recorded in the effective tables of the remaining block address comparator circuits 50-3 through 50-n, there is no accessing of the substitutive candidate memory blocks AMB3 through AMBn.

Thus, in cases where defective blocks are present, the accessible memory blocks are limited to m blocks, MB0 through MBm, regardless of the number of defective blocks.

On the other hand, in cases where no defective memory blocks are detected in the load test, the good/bad data 54 is set as good data "0". Accordingly, the invalid access detection circuit 53 is placed in an inactive state, so that even if an external input block address coincides with an substitutive candidate block address, there is no output of a break signal so that access is prohibited.

Furthermore, since the effective tables ET in the block address comparator circuits 50 all show ineffective data "0", there is no direct selection of substitutive blocks AMB1 through AMBn from the block address comparator circuits. Furthermore, the transistor 62 of the block address switching circuit 58 is not switched off. Accordingly, block addresses input from the outside are all sent to the memory block decoder MB-DEC, and for all of the memory blocks, the selection signals BS0 through BSm or B1 through Bn are placed in a selected state.

In the second embodiment, unlike the first embodiment, the outputs of the block address comparator circuits 50 do not sent substitutive block addresses to the decoder instead of the input block addresses. The outputs of the block address comparator circuits 50 are used "as is" as the selection signals B1 through Bn for the substitutive candidate blocks. Accordingly, in cases where there is access to a defective block, delay of the access time to the substitutive candidate blocks as a result of the operation of the block address comparator circuits is avoided.

The invalid access detection circuit 53 shown in FIG. 9 may also be installed in parallel as a plurality of circuits equal in number to the number of substitutive candidate block addresses, as in the case of the block address comparator circuits 50. In this case, the outputs of the comparator circuits 56 installed in parallel inside the invalid access detection circuit 53 are sent to an OR gate, and break signals BRK are output according to the OR logic of this gate.

Furthermore, the comparator circuit and switching circuit used in the first embodiment shown in FIG. 6A, as with the block address comparator circuit 50 illustrated in FIG. 9, may also be constructed in a parallel construction in which there is a comparator circuit 38 and switching circuit 40 for each defective block address. Similarly, invalid access circuit shown in FIG. 6B may also be constructed in a parallel construction in which there is a circuit for each defective block address.

Furthermore, in the abovementioned first embodiment, the correspondence between the defective block addresses and substitutive block addresses is set as an effective state or ineffective state by storing effective data or ineffective data in the effective table ET. As alternative means, it would also be possible to record "000" or the like as initial values in the defective block address storage region 16 and substitutive block address (FBA) storage region 18, and to detect whether or not the correspondence table is effective, according to a detection, by means of an EOR circuit, of whether or not defective block addresses coincide with substitutive block addresses. If defective block addresses are not recorded, both addresses will coincide, while if defective block addresses are recorded, the addresses will not coincide. In this way, it can be judged whether or not the correspondence table is effective. In the second embodiment, since the substitutive block addresses are already recorded, this method is not appropriate.

Furthermore, in the abovementioned second embodiment, it would also be possible to devise the circuit so that in cases where it is detected by the block address comparator circuit that an input address coincides with the block address of a defective memory block, the block address of the external input address is replaced by the block address of an substitutive candidate block without directly selecting this substitutive candidate block. The block address comparator circuit in this case can be constructed in the same manner as the block address switching circuit 40 in the first embodiment.

Thus, the present invention makes it possible to provide a memory circuit in which the memory cell region in the chip is effectively utilized, and defective cells can be salvaged. Furthermore, access can be accomplished with addresses from the outside varied in a sequential manner.

What is claimed is:

1. A memory circuit capable of salvaging defective cells, comprising:

a plurality of memory blocks, each having a plurality of memory cells;

a defective block address storage region which stores a block address of defective memory block that has a defective cell; and a comparator circuit which detects access to the defective memory block by comparing a block address being accessed with said defective memory block address, wherein in case where said comparator circuit detects access to said defective memory block, said defective memory block is replaced by a memory block which has an uppermost address (or lowermost address) among said plurality of memory blocks.

2. The memory circuit according to claim 1, wherein in case where a plurality of said defective memory blocks are present, said plurality of defective memory blocks are replaced by substitutive memory blocks which are allocated in order from the memory block that has the uppermost address (or lowermost address) among said plurality of memory blocks.

3. The memory circuit according to claim 2, wherein in case where said substitutive memory block is a defective memory block, the next available memory block following said defective substitutive memory block is taken as a substitutive memory block, and a switch is made from said defective memory blocks.

4. The memory circuit according to claim 1, further comprising an invalid access detection circuit which in case where said block address being accessed corresponds to the block address of a substitutive memory block, prohibits the access.

5. The memory circuit according to claim 1, further comprising:

an substitutive block address storage region which stores a block address of a substitutive memory block; and a block address switching circuit which when access to said defective memory blocks is detected by said comparator circuit, replaces said block address being accessed with corresponding substitutive block address.

6. The memory circuit according to claim 5, further comprising an effective table storage region which, corresponding to the defective block address storage region and the substitutive block address storage region, indicates whether or not said storage regions are effective, wherein, when said effective table storage region has an effective data, said comparator circuit is activated, and when said effective table storage region has an ineffective data, said comparator circuit is inactivated.

7. The memory circuit according to claim 1, wherein when said comparator circuit detects the access to said defective memory block, said comparator circuit outputs block selection signal for corresponding memory block with said substitutive block address.

8. The memory circuit according to claim 1, wherein when said defective memory blocks are not present, all of said plurality of memory blocks are accessible.

9. A memory circuit capable of salvaging defective cells, comprising:

a plurality of ordinary memory blocks, each having a plurality of memory cells;

a plurality of substitutive candidate memory blocks each of which has a plurality of memory cells, and which are substituted for a defective memory block among said ordinary memory blocks; and a comparator circuit which detects an access to defective memory block by comparing a block address of said defective memory block with a block address being accessed, wherein in case where no defective memory block is present among said ordinary memory blocks and substitutive candidate memory blocks, said ordinary memory blocks and substitutive candidate memory blocks are selected according to said block address being accessed, and in case where defective memory block is present among said ordinary memory blocks, and said comparator circuit detects access to the defective memory block, said substitutive candidate memory blocks are selected instead of said defective memory block.

10. The memory circuit according to claim 9, wherein a plurality of said comparator circuits are provided corresponding to said substitutive candidate memory blocks, and said comparator circuits respectively compare said defective block address with said block address being accessed, and output selection signal for the corresponding substitutive candidate memory block in case where said compared addresses coincide.

11. The memory circuit according to claim 10, further comprising:

a block address switching circuit which, when said comparator circuit detects access to the defective memory block, stops a sending of said block address being accessed to a block decoder, and when said comparator circuits do not detect the access to the defective memory block, allows the sending of said block address being accessed to the block decoder.

12. The memory circuit according to claim 10, further comprising effective data storage regions that are provided correspondingly to each of said comparator circuits, and that store effective data that activates said comparator circuits corresponding to said defective block addresses, wherein said comparator circuits are inactivated in case where said effective data is data indicating an ineffective state.

13. The memory circuit according to claim 9, further comprising:

an invalid access detection circuit which prohibits access in case where said block address being accessed corresponds to a block address of the substitutive candidate memory block.

14. A memory circuit capable of salvaging defective cells, comprising:

a plurality of memory blocks, each having a plurality of memory cells;

a defective block address storage region which stores a block address of a defective memory block that has a defective cell;

an substitutive block address storage region which stores a block address of memory block having uppermost address (or lowermost address) among said plurality of memory blocks as a substitutive block address in correspondence with the block address of said defective memory block; and a comparator circuit which detects access to the defective memory block by comparing block address being accessed with said defective memory block address, wherein in case where said comparator circuit detects the access to the defective memory block, said block address being accessed is replaced by the corresponding substitutive block address.

15. The memory circuit according to claim 14, wherein in case where a plurality of said defective memory blocks are present, substitutive block addresses corresponding to said plurality of defective memory blocks are allocated in order from the uppermost address (or lowermost address) among the block addresses of the plurality of memory blocks.

16. The memory circuit according to claim 14, further comprising:

an invalid access detection circuit which prohibits access when said block address being accessed corresponds to said substitutive block address.

* * * * *